United States Patent
Tasic et al.

(10) Patent No.: US 9,603,187 B2
(45) Date of Patent: Mar. 21, 2017

(54) OMNI-BAND AMPLIFIERS

(71) Applicant: QUALCOMM Incorporated, San Diego, CA (US)

(72) Inventors: Aleksandar Miodrag Tasic, San Diego, CA (US); Anosh Bomi Davierwalla, San Diego, CA (US); Chiewcharn Narathong, San Diego, CA (US); Klaas van Zalinge, La Jolla, CA (US)

(73) Assignee: QUALCOMM Incorporated, San Diego, CA (US)

( * ) Notice: Subject to any disclaimer, the term of this patent is extended or adjusted under 35 U.S.C. 154(b) by 111 days.

(21) Appl. No.: 13/677,017

(22) Filed: Nov. 14, 2012

(65) Prior Publication Data

US 2014/0134960 A1 May 15, 2014

(51) Int. Cl.
*H04W 88/02* (2009.01)
*H03F 3/193* (2006.01)
*H03F 3/68* (2006.01)
*H04B 1/00* (2006.01)

(52) U.S. Cl.
CPC ............ *H04W 88/02* (2013.01); *H03F 3/193* (2013.01); *H03F 3/68* (2013.01); *H04B 1/0053* (2013.01)

(58) Field of Classification Search
CPC ... H03F 3/72; H03F 1/223; H03F 1/56; H03F 2200/222; H03F 1/565; H03F 1/26; H03F 1/14; H03F 2203/7215; H03F 2200/27; H03F 1/342; H03F 1/226; H03F 3/68; H03F 2200/294; H03G 1/0088; H03H 7/383
See application file for complete search history.

(56) References Cited

U.S. PATENT DOCUMENTS

| | | | |
|---|---|---|---|
| 5,015,968 A * | 5/1991 | Podell et al. | 330/277 |
| 7,023,272 B2 | 4/2006 | Hung et al. | |
| 7,474,158 B1 | 1/2009 | Yim et al. | |
| 7,714,663 B2 | 5/2010 | Gong et al. | |

(Continued)

OTHER PUBLICATIONS

International Search Report and Written Opinion—PCT/US2013/069752—ISA/EPO—May 13, 2014.

(Continued)

*Primary Examiner* — Ping Hsieh
*Assistant Examiner* — James Yang
(74) *Attorney, Agent, or Firm* — Liberty E. Mann

(57) ABSTRACT

Omni-band amplifiers support multiple band groups. In an exemplary design, an apparatus (e.g., a wireless device, an integrated circuit, etc.) includes at least one gain transistor and a plurality of cascode transistors for a plurality of band groups. Each band group covers a plurality of bands. The gain transistor(s) receive an input radio frequency (RF) signal. The cascode transistors are coupled to the gain transistor(s) and provide an output RF signal for one of the plurality of band groups. In an exemplary design, the gain transistor(s) include a plurality of gain transistors for the plurality of band groups. One gain transistor and one cascode transistor are enabled to amplify the input RF signal and provide the output RF signal for the selected band group. The gain transistors may be coupled to different taps of a single source degeneration inductor or to different source degeneration inductors.

20 Claims, 13 Drawing Sheets

(56) References Cited

U.S. PATENT DOCUMENTS

| | | | |
|---|---|---|---|
| 8,022,772 | B2 | 9/2011 | Cassia et al. |
| 9,154,356 | B2 | 10/2015 | Tasic et al. |
| 9,154,357 | B2 | 10/2015 | Tasic et al. |
| 9,160,598 | B2 | 10/2015 | Davierwalla et al. |
| 2008/0081590 | A1* | 4/2008 | Das .............................. 455/341 |
| 2008/0186409 | A1 | 8/2008 | Kang et al. |
| 2011/0084791 | A1* | 4/2011 | Mun et al. ..................... 336/200 |
| 2011/0128079 | A1* | 6/2011 | Hwang .................. H03F 1/565 330/295 |
| 2011/0175687 | A1* | 7/2011 | Morris, III ...................... 333/32 |
| 2011/0221531 | A1* | 9/2011 | Kim et al. ..................... 330/284 |
| 2013/0069722 | A1* | 3/2013 | Jeong et al. .................. 330/253 |
| 2013/0099865 | A1* | 4/2013 | Do .......................... H03F 1/223 330/277 |
| 2014/0113578 | A1 | 4/2014 | Xu et al. |

OTHER PUBLICATIONS

Ito T., et al., "Characterization of On-Chip Multiport Inductors for Small-Area RF Circuits", IEEE Transactions on Circuits and Systems I: Regular Papers, IEEE, US, vol. 56, No. 8, Aug. 1, 2009 (Aug. 1, 2009), pp. 1590-1597, XP011333489, ISSN 1549-8328, DOI: 10.1109/TCSI.2008.2010096 Section B. Proposed DA; figure 6.

Koh K.J., et al., "A merged structure of LNA & sub-harmonic mixer for multi-band DCR applications", 2003 IEEE MTT-S International Microwave Symposium Digest, (IMS 2003), Philadelphia, PA, Jun. 8-13, 2003; [IEEE MTT-S International Microwave Symposium], New York, NY: IEEE, US, Jun. 8, 2003 (Jun. 8, 2003), pp. 243-246 vol. 1, XP032412376, DOI: 10.1109/MWSYM.2003.1210925 ISBN: 978-0-7803-7695-3 Section A. Low Noise Amplifier Design; figure 2.

Zhang F., et al., "An Agile, Ultra-Wideband Pulse Radio Transceiver With Discrete-Time Wideband-IF", IEEE Journal of Solid-State Circuits, IEEE Service Center, Piscataway, NJ, USA, vol. 44, No. 5, May 1, 2009 (May 1, 2009), pp. 1336-1351, XP011256780, ISSN: 0018-9200, DOI: 10.1109/JSSC.2009.2020681 Section A. DLNA; figure 5.

Zhang F., et al., "Low power programmable-gain CMOS distributed LNA for ultra-wideband applications", VLSI Circuits, 2005, Digest of Technical Papers, 2005 Symposium on, IEEE, Piscataway, NJ, USA, Jun. 16, 2005 (Jun. 16, 2005), pp. 78-81, XP010818340, DOI: 10.1109/VLSIC.2005.1469338 ISBN: 978-4-900784-01-7 Section: Distributed Amplifier Tradeoffs; figure 1.

* cited by examiner

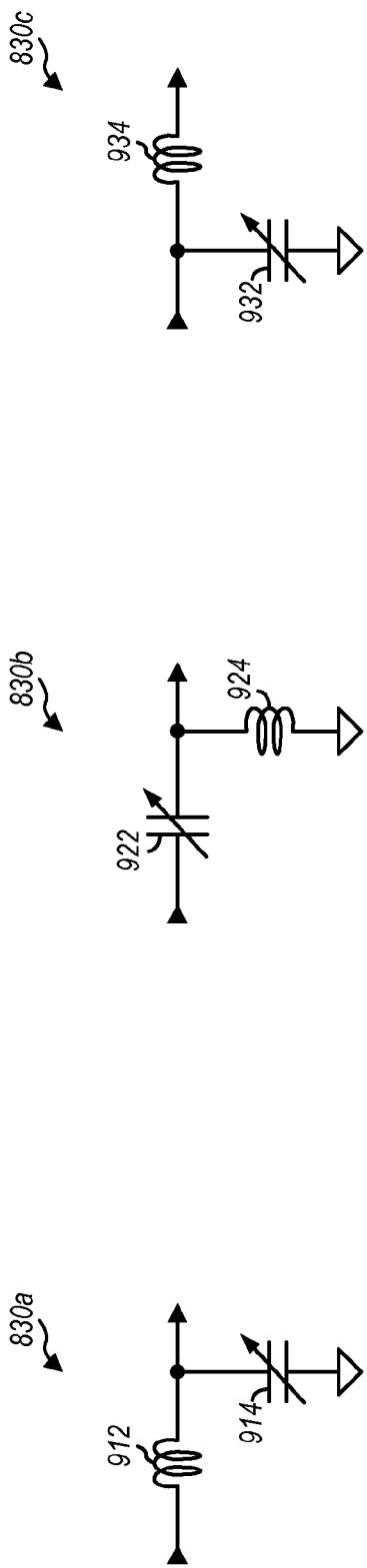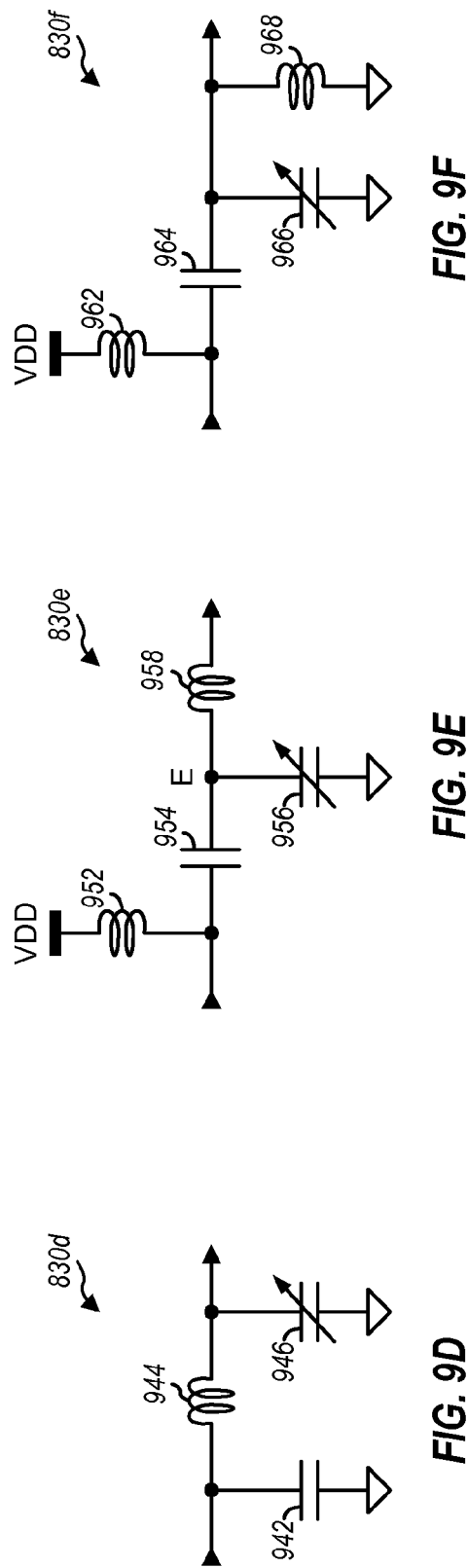

OMNI-BAND AMPLIFIERS

BACKGROUND

I. Field

The present disclosure relates generally to electronics, and more specifically to amplifiers.

II. Background

A wireless device (e.g., a cellular phone or a smartphone) in a wireless communication system may transmit and receive data for two-way communication. The wireless device may include a transmitter for data transmission and a receiver for data reception. For data transmission, the transmitter may modulate a radio frequency (RF) carrier signal with data to obtain a modulated RF signal, amplify the modulated RF signal to obtain an amplified RF signal having the proper output power level, and transmit the amplified RF signal via an antenna to a base station. For data reception, the receiver may obtain a received RF signal via the antenna and may amplify and process the received RF signal to recover data sent by the base station.

A wireless device may support operation over a wide frequency range. The wireless device may include a number of amplifiers, with each amplifier being designed to operate over a portion of the wide frequency range supported by the wireless device. It is desirable to support operation over a wide frequency range with as few amplifiers as possible.

BRIEF DESCRIPTION OF THE DRAWINGS

FIGS. 9A to 9F shows six exemplary designs of a tunable matching circuit.

DETAILED DESCRIPTION

The detailed description set forth below is intended as a description of exemplary designs of the present disclosure and is not intended to represent the only designs in which the present disclosure can be practiced. The term "exemplary" is used herein to mean "serving as an example, instance, or illustration." Any design described herein as "exemplary" is not necessarily to be construed as preferred or advantageous over other designs. The detailed description includes specific details for the purpose of providing a thorough understanding of the exemplary designs of the present disclosure. It will be apparent to those skilled in the art that the exemplary designs described herein may be practiced without these specific details. In some instances, well-known structures and devices are shown in block diagram form in order to avoid obscuring the novelty of the exemplary designs presented herein.

Omni-band amplifiers supporting a wide frequency range covering multiple band groups are disclosed herein. The omni-band amplifiers may also be referred to as universal amplifiers, etc. The omni-band amplifiers may be used for various types of electronic devices such as wireless communication devices.

Figure 1:
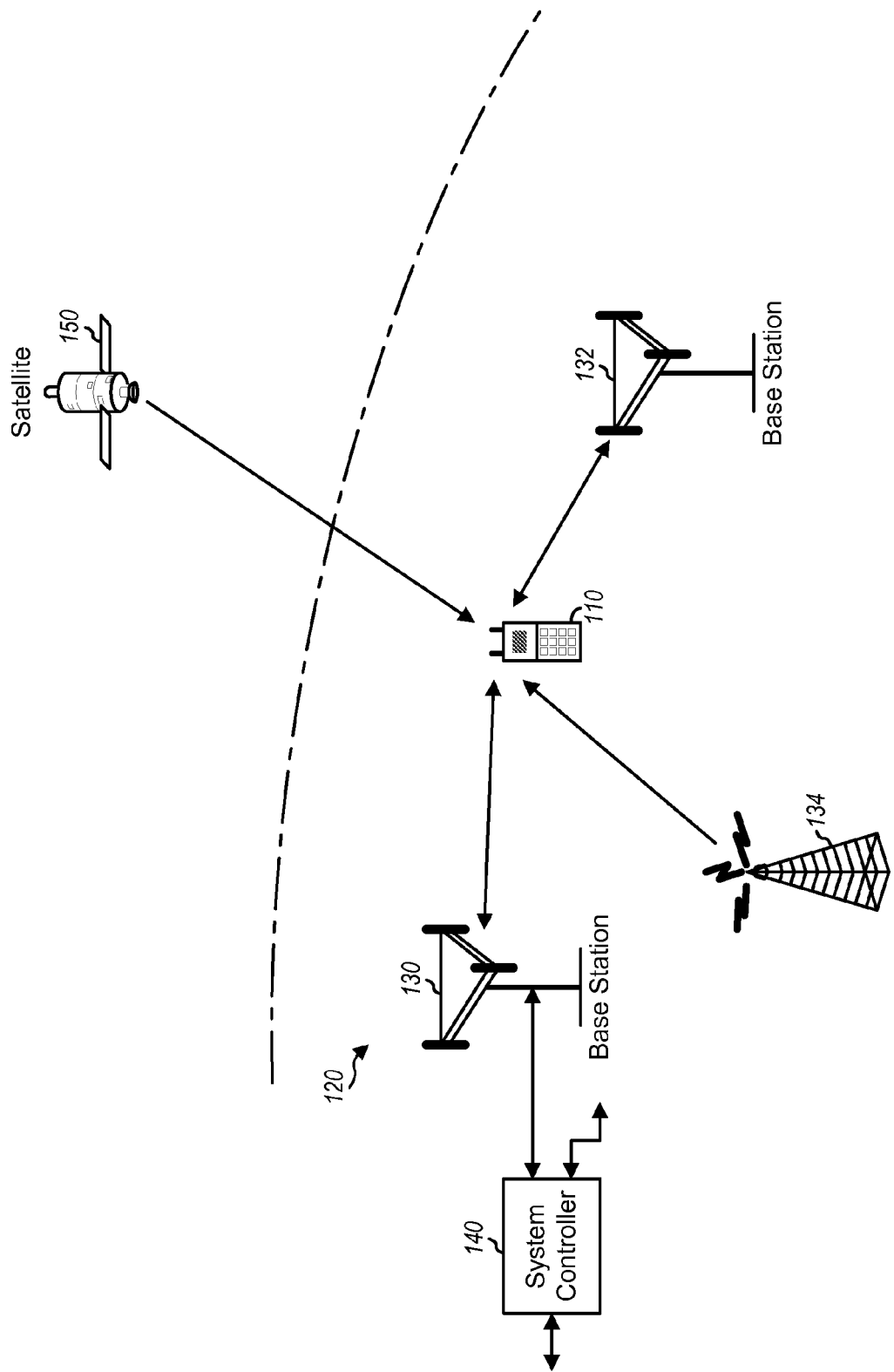
FIG. 1 shows a wireless device communicating with a wireless system.

FIG. 1 shows a wireless device 110 communicating with a wireless communication system 120. Wireless system 120 may be a Long Term Evolution (LTE) system, a Code Division Multiple Access (CDMA) system, a Global System for Mobile Communications (GSM) system, a wireless local area network (WLAN) system, or some other wireless system. A CDMA system may implement Wideband CDMA (WCDMA), CDMA 1x, Evolution-Data Optimized (EVDO), Time Division Synchronous CDMA (TD-SCDMA), or some other version of CDMA. For simplicity, FIG. 1 shows wireless system 120 including two base stations 130 and 132 and one system controller 140. In general, a wireless system may include any number of base stations and any set of network entities.

Wireless device 110 may also be referred to as a user equipment (UE), a mobile station, a terminal, an access terminal, a subscriber unit, a station, etc. Wireless device 110 may be a cellular phone, a smartphone, a tablet, a wireless modem, a personal digital assistant (PDA), a handheld device, a laptop computer, a smartbook, a netbook, a cordless phone, a wireless local loop (WLL) station, a Bluetooth device, etc. Wireless device 110 may communicate with wireless system 120. Wireless device 110 may also receive signals from broadcast stations (e.g., a broadcast station 134), signals from satellites (e.g., a satellite 150) in one or more global navigation satellite systems (GNSS), etc. Wireless device 110 may support one or more radio technologies for wireless communication such as LTE, WCDMA, CDMA 1x, EVDO, TD-SCDMA, GSM, 802.11, etc.

Figure 2:
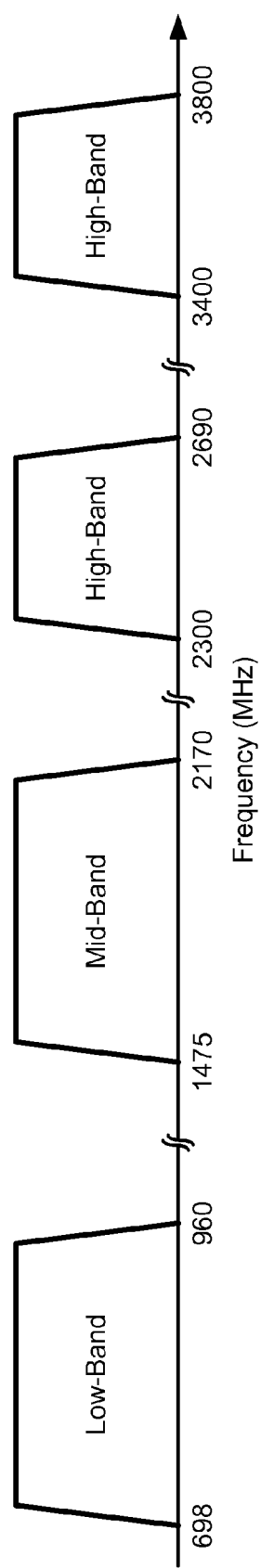
FIG. 2 shows three exemplary band groups.

FIG. 2 shows three exemplary band groups that may be supported by wireless device 110. Wireless device 110 may be able to operate in low-band (LB) covering frequencies lower than 1000 megahertz (MHz), mid-band (MB) covering frequencies from 1000 MHz to 2300 MHz, and/or high-band (HB) covering frequencies higher than 2300 MHz. For example, low-band may cover 698 to 960 MHz, mid-band may cover 1475 to 2170 MHz, and high-band may cover 2300 to 2690 MHz and 3400 to 3800 MHz, as shown in FIG. 2. Low-band, mid-band, and high-band refer to three groups of bands (or band groups), with each band group including a number of frequency bands (or simply, "bands"). Each band may cover up to 200 MHz. LTE Release 11 supports 35 bands, which are referred to as LTE/UMTS bands and are listed in 3GPP TS 36.101.

In general, any number of band groups may be defined. Each band group may cover any range of frequencies, which may or may not match any of the frequency ranges shown in FIG. 2. Each band group may also include any number of bands.

Figure 3:
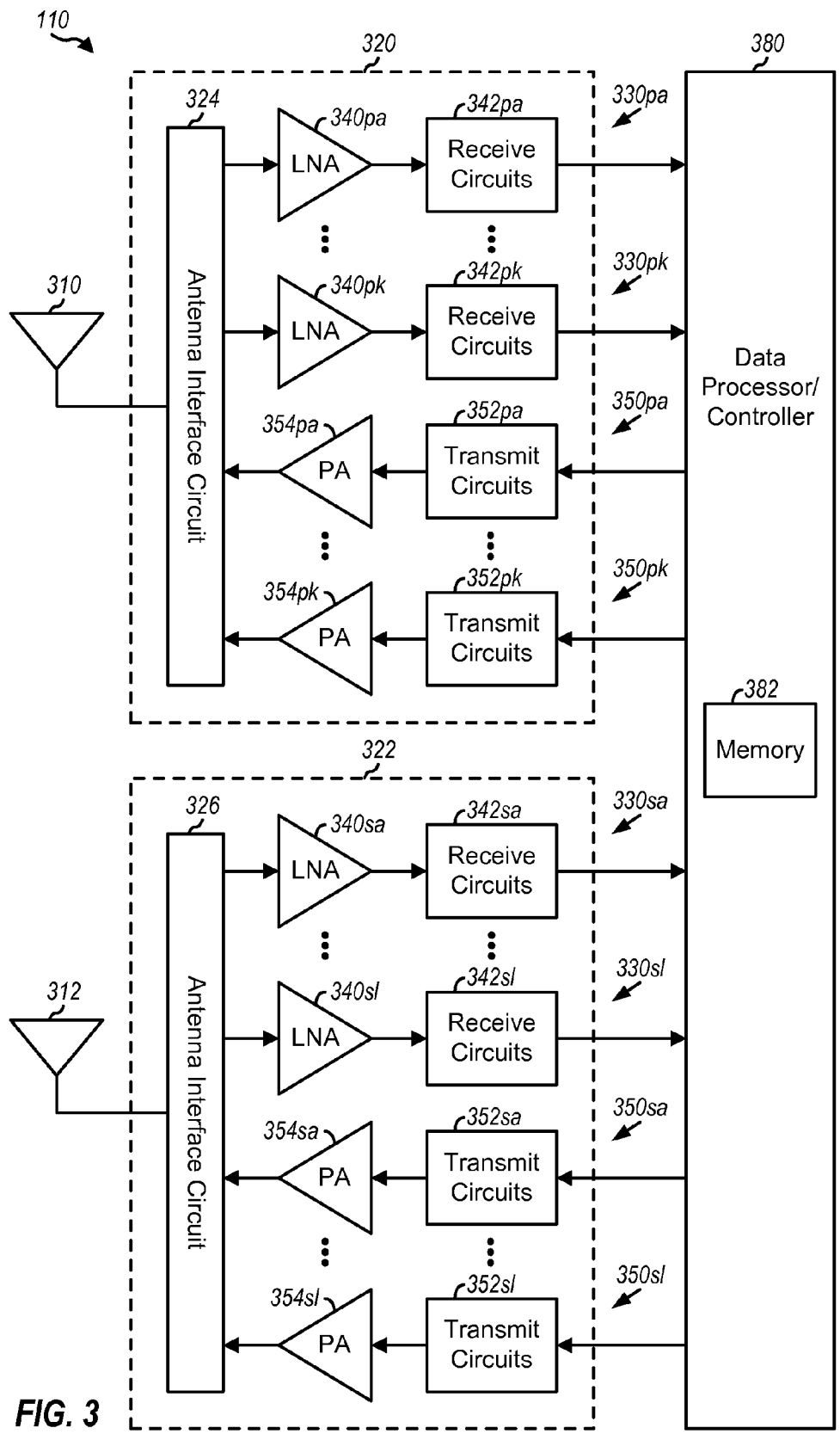
FIG. 3 shows a block diagram of the wireless device in FIG. 1.

FIG. 3 shows a block diagram of an exemplary design of wireless device 110 in FIG. 1. In this exemplary design, wireless device 110 includes a transceiver 320 coupled to a primary antenna 310, a transceiver 322 coupled to a secondary antenna 312, and a data processor/controller 380. Transceiver 320 includes multiple (K) receivers 330pa to 330pk and multiple (K) transmitters 350pa to 350pk to support multiple frequency bands, multiple radio technologies, carrier aggregation, etc. Transceiver 322 includes L receivers 330sa to 330sl and L transmitters 350sa to 350sl to support multiple frequency bands, multiple radio technologies, carrier aggregation, receive diversity, multiple-input multiple-output (MIMO) transmission from multiple transmit antennas to multiple receive antennas, etc.

In the exemplary design shown in FIG. 3, each receiver 330 includes an LNA 340 and receive circuits 342. For data reception, antenna 310 receives signals from base stations and/or other transmitter stations and provides a received RF signal, which is routed through an antenna interface circuit 324 and presented as an input RF signal to a selected receiver. Antenna interface circuit 324 may include switches, duplexers, transmit filters, receive filters, matching circuits, etc. The description below assumes that receiver 330pa is the selected receiver. Within receiver 330pa, an LNA 340pa amplifies the input RF signal and provides an output RF signal. Receive circuits 342pa downconvert the output RF signal from RF to baseband, amplify and filter the downconverted signal, and provide an analog input signal to data processor 380. Receive circuits 342pa may include mixers, filters, amplifiers, matching circuits, an oscillator, a local oscillator (LO) generator, a phase locked loop (PLL), etc. Each remaining receiver 330 in transceivers 320 and 322 may operate in similar manner as receiver 330pa.

In the exemplary design shown in FIG. 3, each transmitter 350 includes transmit circuits 352 and a power amplifier (PA) 354. For data transmission, data processor 380 processes (e.g., encodes and modulates) data to be transmitted and provides an analog output signal to a selected transmitter. The description below assumes that transmitter 350pa is the selected transmitter. Within transmitter 350pa, transmit circuits 352pa amplify, filter, and upconvert the analog output signal from baseband to RF and provide a modulated RF signal. Transmit circuits 352pa may include amplifiers, filters, mixers, matching circuits, an oscillator, an LO generator, a PLL, etc. A PA 354pa receives and amplifies the modulated RF signal and provides a transmit RF signal having the proper output power level. The transmit RF signal is routed through antenna interface circuit 324 and transmitted via antenna 310. Each remaining transmitter 350 in transceivers 320 and 322 may operate in similar manner as transmitter 350pa.

FIG. 3 shows an exemplary design of receiver 330 and transmitter 350. A receiver and a transmitter may also include other circuits not shown in FIG. 3, such as filters, matching circuits, etc. All or a portion of transceivers 320 and 322 may be implemented on one or more analog integrated circuits (ICs), RF ICs (RFICs), mixed-signal ICs, etc. For example, LNAs 340 and receive circuits 342 may be implemented on one module, which may be an RFIC, etc. The circuits in transceivers 320 and 322 may also be implemented in other manners.

Data processor/controller 380 may perform various functions for wireless device 110. For example, data processor 380 may perform processing for data being received via receivers 330 and data being transmitted via transmitters 350. Controller 380 may control the operation of the various circuits within transceivers 320 and 322. A memory 382 may store program codes and data for data processor/controller 380. Data processor/controller 380 may be implemented on one or more application specific integrated circuits (ASICs) and/or other ICs.

Wireless device 110 may support multiple band groups, multiple radio technologies, and/or multiple antennas. Wireless device 110 may include a number of LNAs to support reception via the multiple band groups, multiple radio technologies, and/or multiple antennas.

In an aspect of the present disclosure, omni-band LNAs may be used to support reception via multiple band groups. An omni-band LNA is an LNA that supports multiple band groups and has (i) a single input for all supported band groups and (ii) multiple outputs for the multiple band groups, e.g., one output for each band group. An omni-band LNA may receive an input RF signal at its input and provide an output RF signal at one of its multiple outputs. An omni-band LNA covers multiple band groups and is different from a multi-band LNA that covers multiple bands in the same band group.

Omni-band LNAs may be implemented with various circuit designs. Some exemplary designs of omni-band LNAs are described below. Omni-band LNAs may also be implemented with transistors of various types. Some exemplary designs of omni-band LNAs implemented with N-channel metal oxide semiconductor (NMOS) transistors are described below.

Figure 4A:
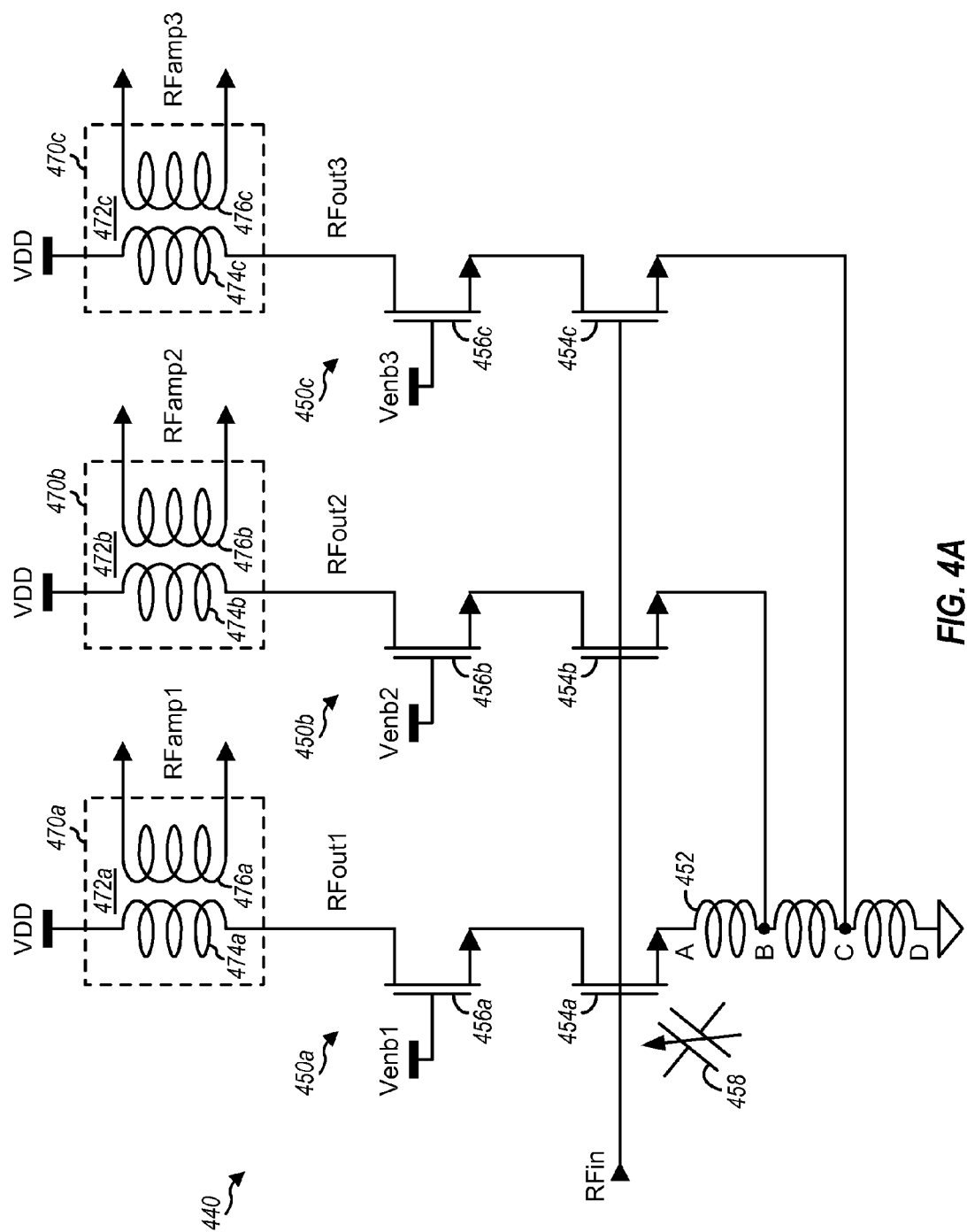
FIGS. 4A to 4D show an omni-band low noise amplifier (LNA) with a shared source degeneration inductor.

FIG. 4A shows a schematic diagram of an exemplary design of an omni-band LNA 440 with a shared source degeneration inductor. Omni-band LNA 440 may be used for any one of LNAs 340 in FIG. 3. In the exemplary design shown in FIG. 4A, omni-band LNA 440 includes three amplifier circuits 450a, 450b and 450c for three band groups of low-band, mid-band and high-band, respectively.

In the exemplary design shown in FIG. 4A, each amplifier circuit 450 includes a gain transistor 454 coupled to a cascode transistor 456 and also to a multi-tap source degeneration inductor 452. Within amplifier circuit 450a for low-band, a gain transistor 454a has its gate receiving an input RF signal (RFin) and its source coupled to one end of multi-tap inductor 452. Multi-tap inductor 452 has four taps A, B, C and D, with taps A and D corresponding to the two ends of inductor 452. Inductor 452 has tap A coupled to the source of gain transistor 454a and tap D coupled to circuit ground. A cascode transistor 456a has its source coupled to the drain of gain transistor 454a, its gate receiving a first enable control signal (Venb1) for low-band, and its drain coupled to an output of amplifier circuit 450a.

Amplifier circuit 450b for mid-band includes a gain transistor 454b and a cascode transistor 456b, which are coupled in similar manner as gain transistor 454a and cascode transistor 456a in amplifier circuit 450a for low-band. Amplifier circuit 450c for high-band includes a gain transistor 454c and a cascode transistor 456c, which are also coupled in similar manner as gain transistor 454a and cascode transistor 456a in amplifier circuit 450a for low-band. The source of gain transistor 454b for mid-band is coupled to tap B of multi-tap inductor 452, and the source of gain transistor 454c for high-band is coupled to tap C of multi-tap inductor 452. Gain transistors 454a to 454c and cascode transistors 456a to 456c may be implemented with NMOS transistors, as shown in FIG. 4A, or with transistors of other types.

Inductor 452 serves as source degeneration inductors for all three gain transistors 454a, 454b and 454c, which observe progressively smaller source inductances due to their connection at different taps of inductor 452. In particular, gain transistor 454c for high-band is coupled to tap C, which is closest to circuit ground, and hence observes the smallest source degeneration inductance. Gain transistor 454b for mid-band is coupled to higher tap B and hence observes a larger source degeneration inductance. Gain transistor 454a for low-band is coupled to the top end of inductor 452 at tap A and hence observes the largest source degeneration inductance.

In the exemplary design shown in FIG. 4A, a variable capacitor 458 may be present across the gate and source of gain transistor 454a. Capacitor 458 may include parasitic capacitance of gain transistors 454a, 454b and 454c. Capacitor 458 may also include a bank of switchable capacitors, which may be coupled between the gate and source of gain transistor 454a and may be used to fine-tune the input impedance of omni-band LNA 440. Each switchable capacitor may be implemented with a capacitor coupled in series with a switch. The capacitors in the bank may be selected to obtain good input matching for omni-band LNA 440.

Amplifier circuits 450a, 450b and 450c are coupled to three load circuits 470a, 470b and 470c, respectively. In the exemplary design shown in FIG. 4A, each load circuit 470 includes a transformer 472 comprising a primary coil 474 and a secondary coil 476. A coil may also be referred to as an inductor coil, a winding, a conductor, etc. Within load circuit 470a for low-band, a transformer 472a includes (i) a primary coil 474a coupled between the output of amplifier circuit 450a and a power supply (VDD) and (ii) a secondary coil 476a providing a first differential amplified RF signal (RFamp1) to a downconverter for low-band (not shown in FIG. 4A). Load circuit 470b for mid-band includes a transformer 472b having (i) a primary coil 474b coupled between the output of amplifier circuit 450b and the VDD supply and (ii) a secondary coil 476b providing a second differential amplified RF signal (RFamp2) to a downconverter for mid-band (not shown in FIG. 4A). Load circuit 470c for high-band includes a transformer 472c having (i) a primary coil 474c coupled between the output of amplifier circuit 450c and the VDD supply and (ii) a secondary coil 476c providing a third differential amplified RF signal (RFamp3) to a downconverter for high-band (not shown in FIG. 4A). Transformers 472a, 472b and 472c are coupled to the drains of cascode transistors 456a, 456b and 456c, respectively. Transformers 472a, 472b and 472c may be designed to provide good performance for low-band, mid-band, and high-band, respectively.

In one exemplary design, each load circuit 470 may be coupled to a separate downconverter. In another exemplary design, multiple load circuits 470 may be coupled to a shared downconverter via switches. The switches may be controlled to pass an amplified RF signal from one load circuit to the shared downconverter at any given moment. For both exemplary designs, each downconverter may include two mixers to perform quadrature downconversion of an amplified RF signal from RF to either baseband or an intermediate frequency (IF).

Load circuits 470 may also be implemented in other manners. In another exemplary design, a load circuit may include an inductor and possibly a capacitor coupled between the output of an amplifier circuit and the VDD supply. In yet another exemplary design, a load circuit may include a P-channel metal oxide semiconductor (PMOS) transistor having its source coupled to the VDD supply and its drain coupled to the drain of a cascode transistor 456. The PMOS transistor may provide an active load for cascode transistor 456.

Amplifier circuits 450a, 450b and 450c may be implemented in various manners. In an exemplary design, gain transistors 454a, 454b and 454c may have similar transistor sizes, and cascode transistors 456a, 456b and 456c may also have similar transistor sizes. In another exemplary design, gain transistors 454a, 454b and 454c may have different transistor sizes and/or cascode transistors 456a, 456b and 456c may have different transistor sizes. In an exemplary design, gain transistors 454a, 454b and 454c may have similar bias currents, which may be selected to provide good performance for all three band groups. In another exemplary design, gain transistors 454a, 454b and 454c may have different bias currents. The bias current for each gain transistor 454 may be selected to provide good performance for the associated band group.

FIG. 4A shows omni-band LNA 440 including three amplifier circuits 450a, 450b and 450c for three band groups. An omni-band LNA may include fewer or more than three amplifier circuits 450 for fewer or more band groups.

Omni-band LNA 440 receives an input RF signal, which is applied to all three amplifier circuits 450a, 450b and 450c. The input RF signal may include one or more transmissions in one or more bands in a band group of interest, i.e., a selected band group. The amplifier circuit 450 for the selected band group may be enabled to amplify the input RF signal and provide an output RF signal for the selected band group. Load circuit 470 for the selected band group may receive the output RF signal from the enabled amplifier circuit 450 and provide an amplified RF signal for the selected band group. The remaining amplifier circuits 450 for other band groups may be disabled.

Figure 4B:
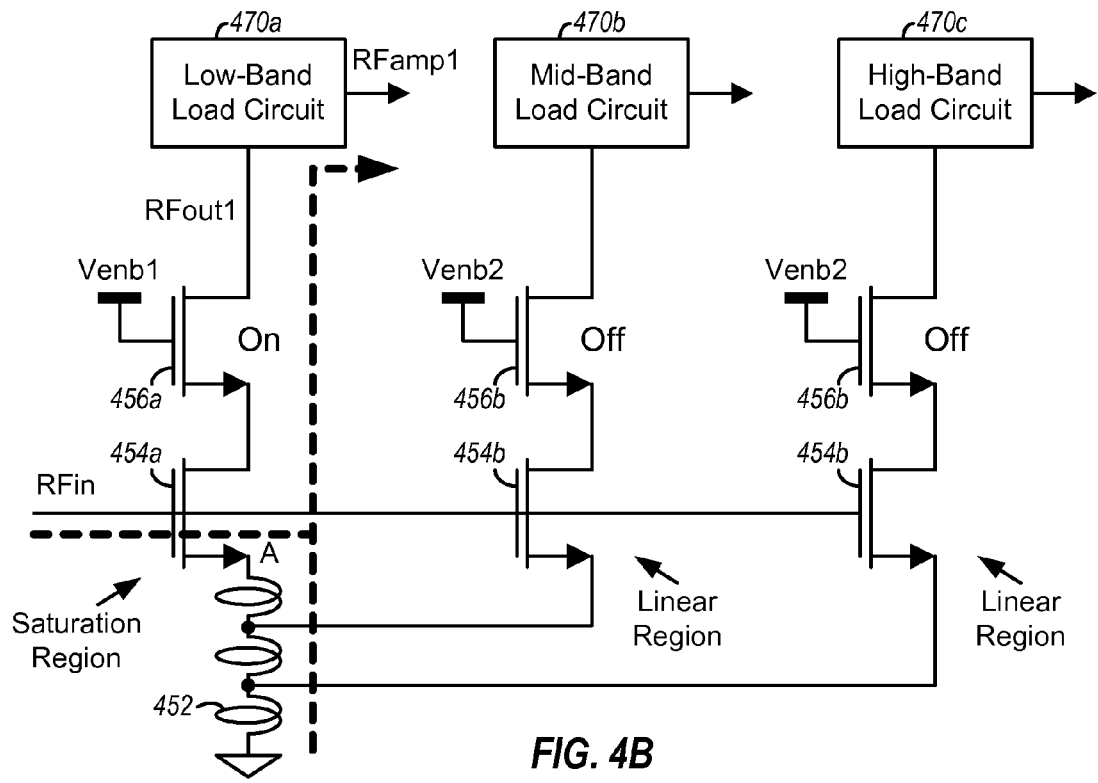

FIG. 4B shows operation of omni-band LNA 440 when low-band is selected. In this case, amplifier circuit 450a is enabled to generate a first output RF signal (RFout1) for low-band by providing an appropriate bias voltage on the Venb1 signal at the gate of cascode transistor 456a. Load circuit 470a receives the RFout1 signal and provides the RFamp1 signal for low-band to a downconverter. Gain transistor 454a observes a large source degeneration inductance via the entire inductor 452. Amplifier circuits 450b and 450c are disabled by providing low voltages on the Venb2 and Venb3 signals at the gates of cascode transistors 456b and 456c, respectively.

Figure 4C:
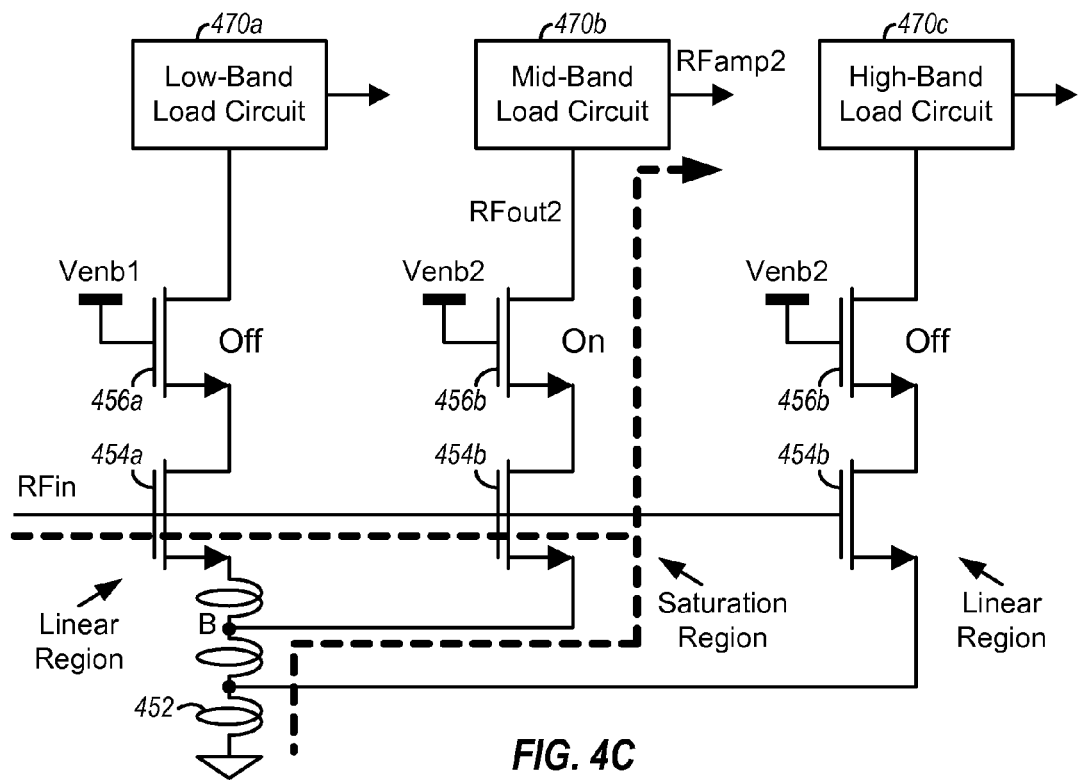

FIG. 4C shows operation of omni-band LNA 440 when mid-band is selected. In this case, amplifier circuit 450b is enabled to generate a second output RF signal (RFout2) for mid-band by providing an appropriate bias voltage on the Venb2 signal at the gate of cascode transistor 456b. Load circuit 470b receives the RFout2 signal and provides the RFamp2 signal for mid-band to a downconverter. Gain transistor 454b observes a medium source degeneration inductance via a portion of inductor 452 from tap B to circuit ground. Amplifier circuits 450a and 450c are disabled by providing low voltages on the Venb1 and Venb3 signals at the gates of cascode transistors 456a and 456c, respectively.

Figure 4D:
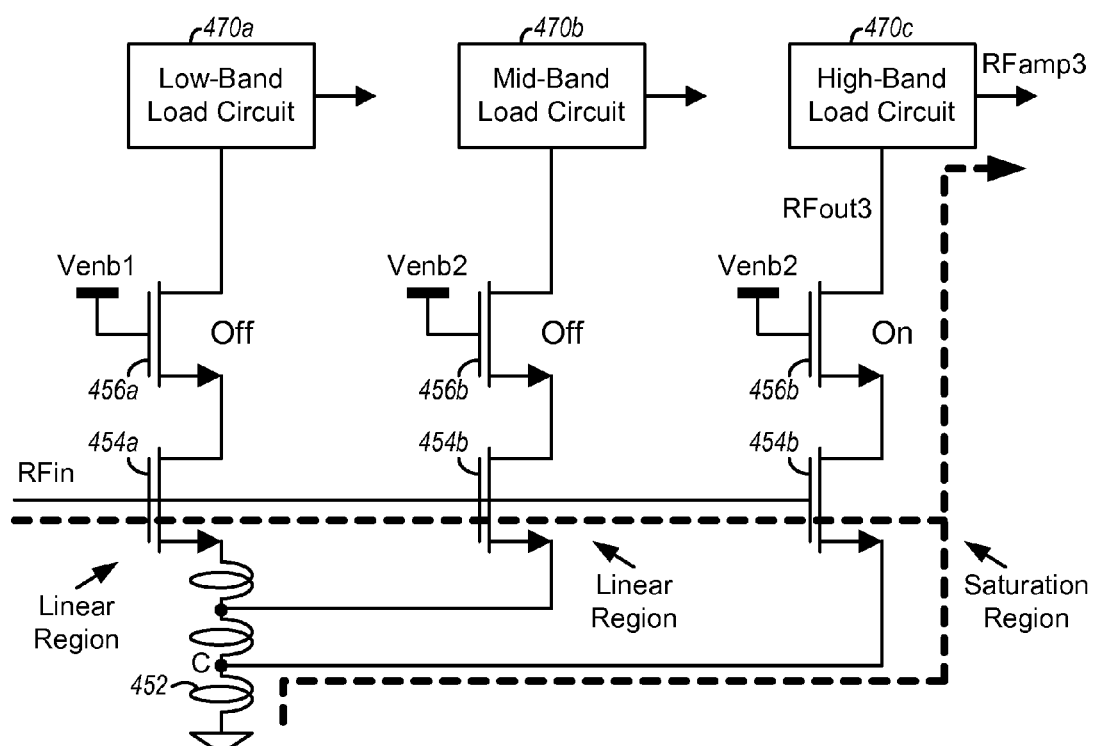

FIG. 4D shows operation of omni-band LNA 440 when high-band is selected.

In this case, amplifier circuit 450c is enabled to generate a third output RF signal (RFout3) for high-band by providing an appropriate bias voltage on the Venb3 signal at the gate of cascode transistor 456c. Load circuit 470c receives the RFout3 signal and provides the RFamp3 signal for high-band to a downconverter. Gain transistor 454c observes a small source degeneration inductance via a portion of inductor 452 from tap C to circuit ground. Amplifier circuits 450a and 450b are disabled by providing low voltages on the Venb1 and Venb2 signals at the gates of cascode transistors 456a and 456b, respectively.

In an exemplary design, a gain transistor in an amplifier circuit may operate in (i) a saturation region when the amplifier circuit is enabled or (ii) a linear region when the amplifier circuit is disabled. Operating the gain transistor in the linear region when the amplifier circuit is disabled may reduce changes in the input impedance of omni-band LNA 440 regardless of which amplifier circuit or band group is selected. The input capacitance ($C_{IN}$) of a gain transistor may be expressed as:

$$C_{IN} = \frac{2}{3} \cdot W \cdot L \cdot C_{OX} \text{ when the amplifier circuit is enabled, and} \quad \text{Eq (1)}$$

$$C_{IN} = \frac{1}{2} \cdot W \cdot L \cdot C_{OX} \text{ when the amplifier circuit is disabled,} \quad \text{Eq (2)}$$

where W is the width and L is the length of the gain transistor, and $C_{OX}$ is a gate oxide capacitance of the gain transistor.

As shown in equations (1) and (2), there may be a finite change in the input impedance of a gain transistor depending on whether an amplifier circuit is enabled or disabled. However, the input impedance of omni-band LNA 440 may be maintained within tolerable limits regardless of which amplifier circuit is selected and even with the change in the input impedance of the gain transistor. Maintaining the input impedance of omni-band LNA 440 within tolerable limits may improve power and/or impedance matching for all band groups.

Figure 5:
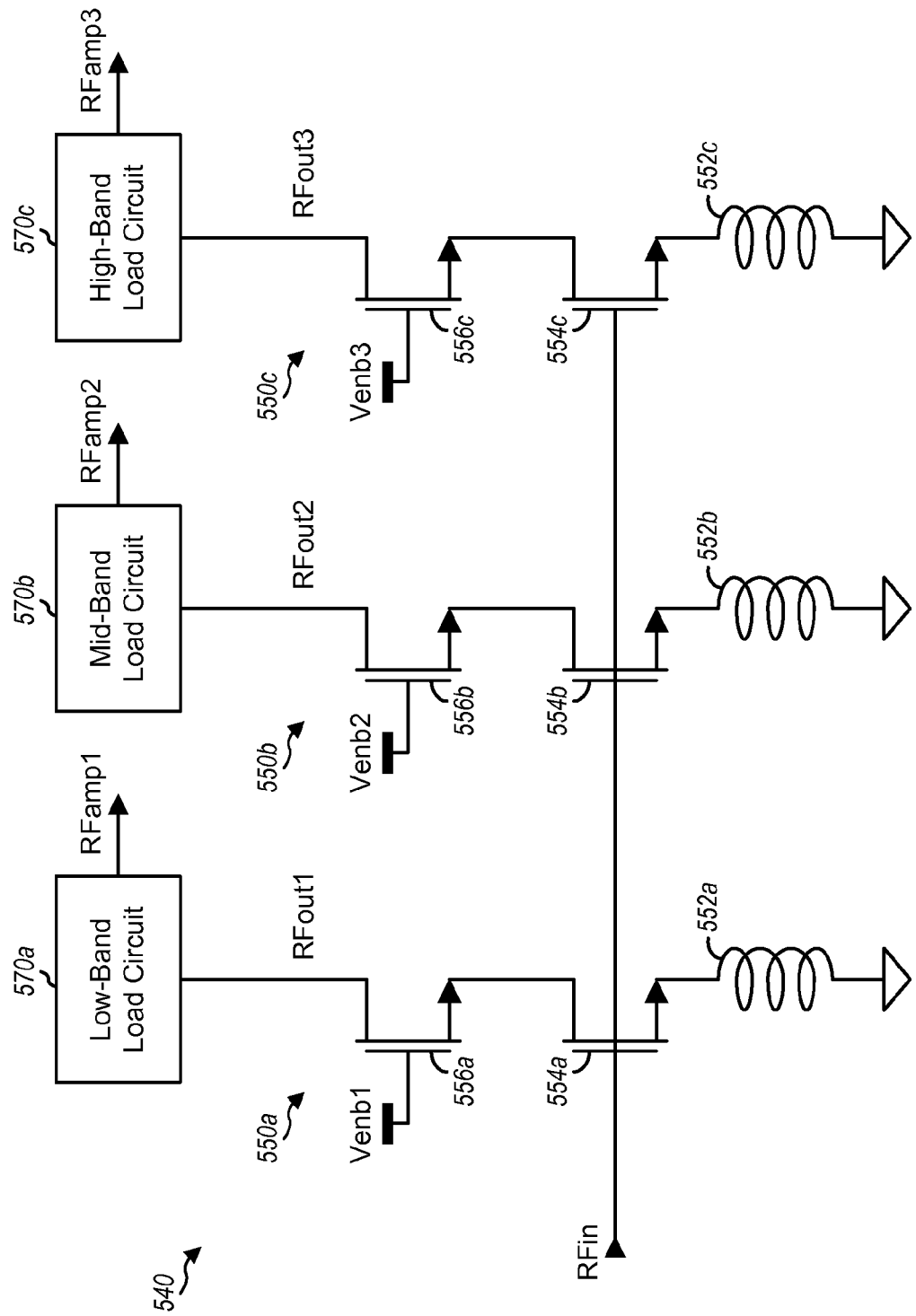
FIG. 5 shows an omni-band LNA with separate source degeneration inductors.

FIG. 5 shows a schematic diagram of an exemplary design of an omni-band LNA 540 with separate source degeneration inductors. Omni-band LNA 540 may also be used for any one of LNAs 340 in FIG. 3. In the exemplary design shown in FIG. 5, omni-band LNA 540 includes three amplifier circuits 550a, 550b and 550c for low-band, mid-band, and high-band, respectively. Each amplifier circuit 550 includes a gain transistor 554 coupled to a cascode transistor 556 and also to a source degeneration inductor 552. Within amplifier circuit 550a for low-band, a gain transistor 554a has its gate receiving an input RF signal and its source coupled to one end of an inductor 552a. The other end of inductor 552a is coupled to circuit ground. A cascode transistor 556a has its source coupled to the drain of gain transistor 554a, its gate receiving a first enable control signal (Venb1) for low-band, and its drain coupled to an output of amplifier circuit 550a.

Amplifier circuit 550b for mid-band includes a gain transistor 554b, a cascode transistor 556b, and an inductor 552b, which are coupled in similar manner as gain transistor 554a, cascode transistor 556a, and inductor 552a in amplifier circuit 550a for low-band. Amplifier circuit 550c for high-band includes a gain transistor 554c, a cascode transistor 556c, and an inductor 552c, which are coupled in similar manner as gain transistor 554a, cascode transistor 556a, and inductor 552a in amplifier circuit 550a for low-band. Inductors 552a, 552b and 552c may be designed to provide good performance for low-band, mid-band, and high-band, respectively. The drains of cascode transistors 556a, 556b, and 556c are coupled to load circuits 570a, 570b and 570c, respectively, which may comprise transformers (e.g., as shown in FIG. 4A) and/or other circuits. Load circuits 570a, 570b and 570c may be designed to provide good performance for low-band, mid-band, and high-band, respectively.

Figure 6:
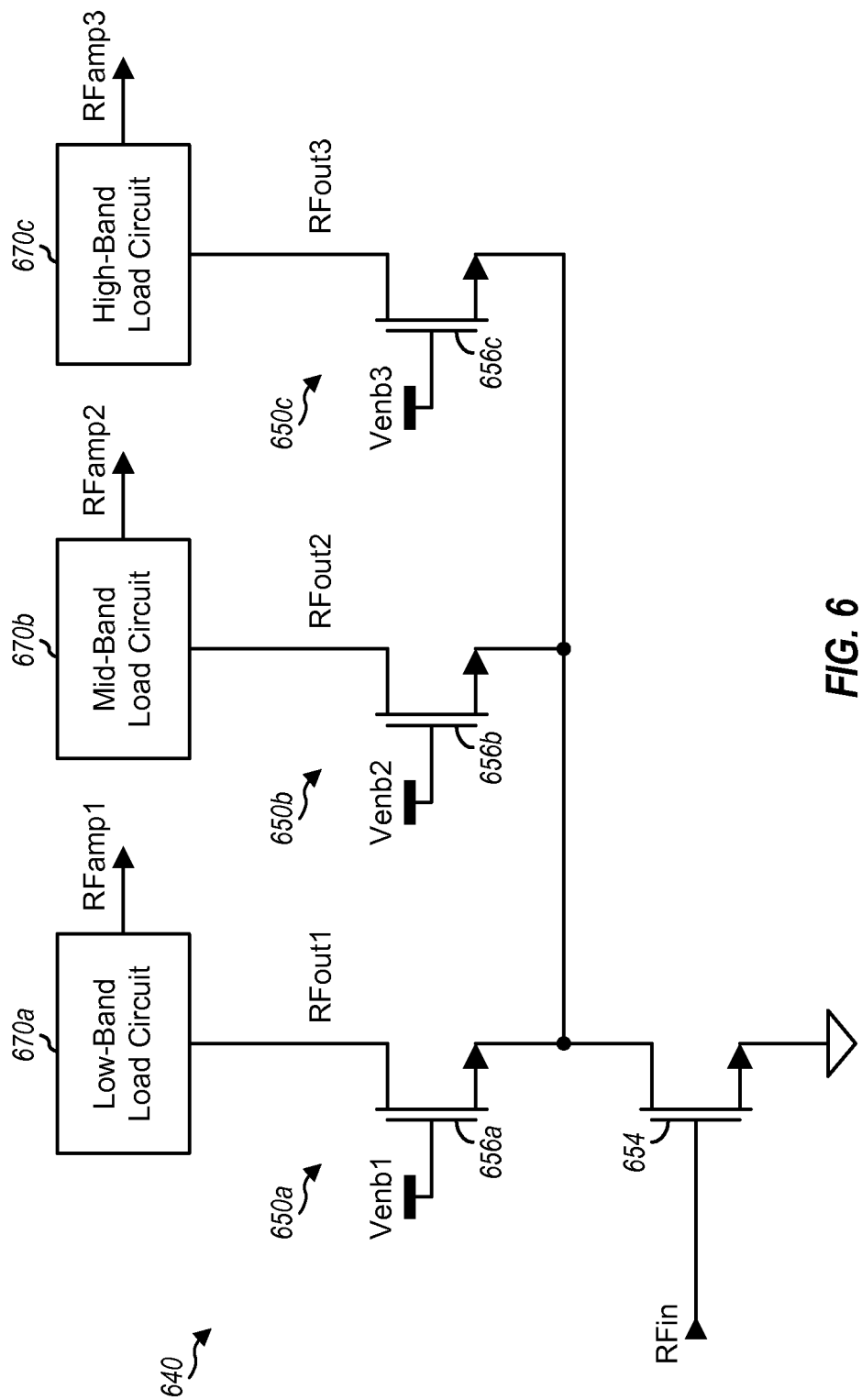
FIG. 6 shows an omni-band LNA without a source degeneration inductor.

FIG. 6 shows a schematic diagram of an exemplary design of an omni-band LNA 640 without a source degeneration inductor. Omni-band LNA 640 may also be used for any one of LNAs 340 in FIG. 3. In the exemplary design shown in FIG. 6, omni-band LNA 640 includes a common gain transistor 654 and three cascode transistors 656a, 656b, and 656c for low-band, mid-band, and high-band, respectively.

Gain transistor 654 has its gate receiving an input RF signal (RFin) and its source coupled to circuit ground. Cascode transistor 656a has its source coupled to the drain of gain transistor 654, its gate receiving a first enable control signal (Venb1) for low-band, and its drain coupled to a load circuit 670a for low-band. Cascode transistor 656b has its source coupled to the drain of gain transistor 654, its gate receiving a second enable control signal (Venb2) for mid-band, and its drain coupled to a load circuit 670b for mid-band. Cascode transistor 656c has its source coupled to the drain of gain transistor 654, its gate receiving a third enable control signal (Venb3) for high-band, and its drain coupled to a load circuit 670c for high-band. Load circuits 670a, 670b and 670c may comprise transformers (e.g., as shown in FIG. 4A) and/or other circuits. Load circuits 670a, 670b and 670c may be designed to provide good performance for low-band, mid-band, and high-band, respectively.

Figure 7:
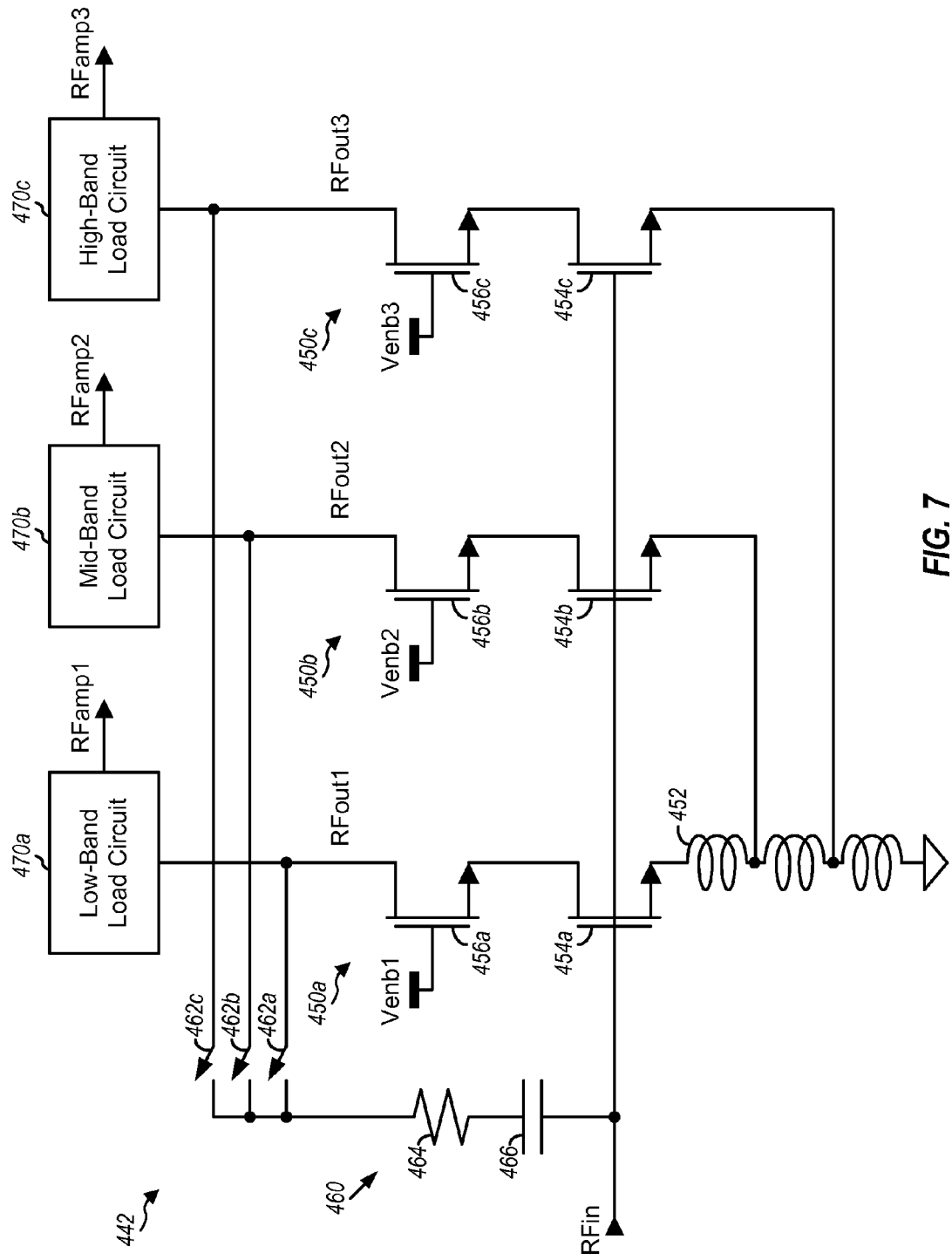
FIG. 7 shows an omni-band LNA with a shared source degeneration inductor and feedback.

FIG. 7 shows a schematic diagram of an exemplary design of an omni-band LNA 442 with a shared source degeneration inductor and feedback. Omni-band LNA 442 may also be used for any one of LNAs 340 in FIG. 3. In the exemplary design shown in FIG. 7, omni-band LNA 442 includes three amplifier circuits 450a, 450b and 450c for low-band, mid-band, and high-band, respectively, as described above for FIG. 4A. Omni-band LNA 442 further includes a feedback circuit 460 coupled between the drains of cascode transistors 456a, 456b and 456c and the gates of gain transistors 454a, 454b and 454c, i.e., between the common input and the outputs of amplifier circuits 450a, 450b and 450c.

In the exemplary design shown in FIG. 7, feedback circuit 460 includes switches 462a, 462b, and 462c, a resistor 464, and a capacitor 466. Resistor 464 and capacitor 466 are coupled in series, with the bottom terminal of capacitor 466 being coupled to the gates of gain transistors 454a, 454b and 454c. Switches 462a, 462b, and 462c have one terminal coupled to resistor 464 and the other terminal coupled to the drains of cascode transistors 456a, 456b and 456c, respectively. Switches 462a, 462b, and 462c may each be closed to connect feedback circuit 460 to its associated cascode transistor 456 and may be opened to disconnect feedback circuit 460 from the associated cascode transistor 456. Feedback circuit 460 may also include one or more active circuits such as a transistor.

In an exemplary design, feedback circuit 460 may be enabled and used for low-band to provide input power match. For mid-band and high-band, feedback circuit 460 may be disabled, and source degeneration inductor 452 may be used for input power match. Feedback circuit 460 may also be used in other manners.

Feedback circuit 460 may help with input matching for omni-band LNA 442. Feedback circuit 460 may also improve the linearity of amplifier circuits 450a, 450b and/or 450c. Each amplifier circuit 450 may be linearized by (i) both source degeneration inductor 452 and feedback circuit 460 when associated switch 462 is closed or (ii) only source degeneration inductor 452 when associated switch 462 is opened. The improved linearity with feedback circuit 460 may allow a smaller inductor 452 to be used to obtain the desired linearity.

Figure 8:
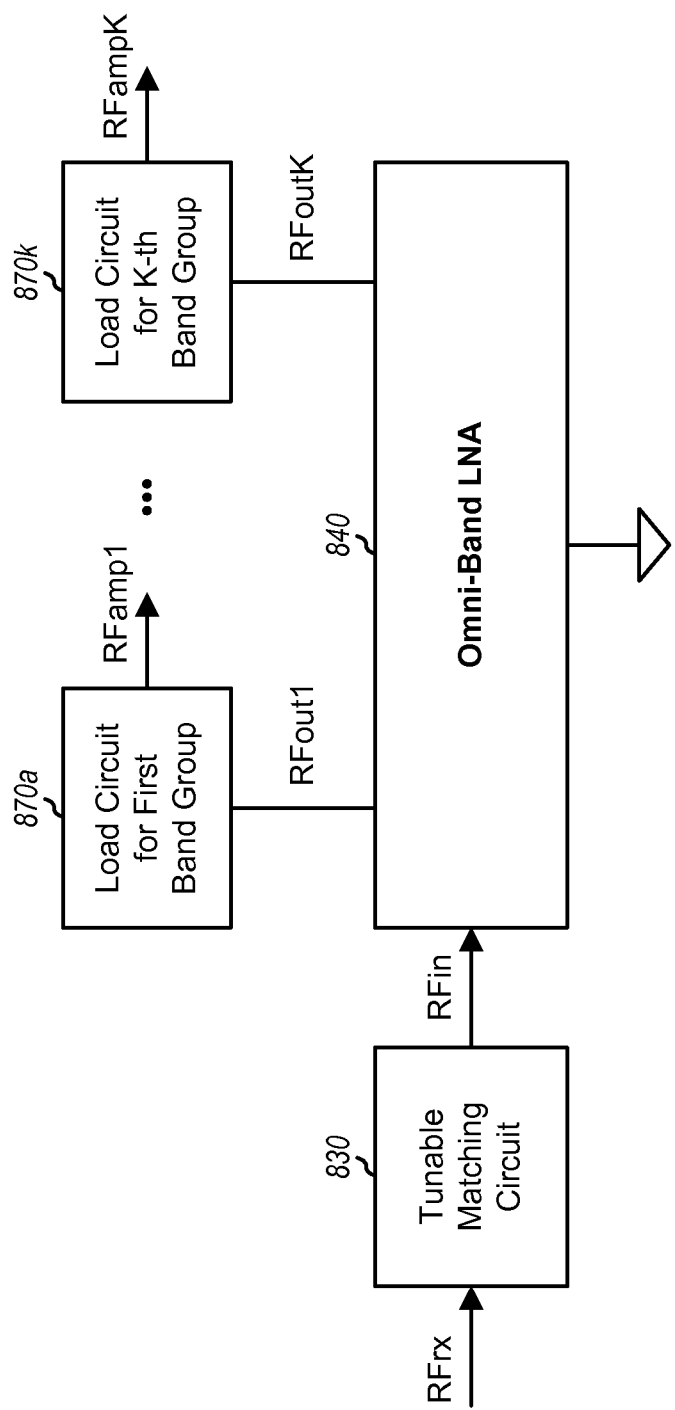
FIG. 8 shows an omni-band LNA with a tunable matching circuit.

FIG. 8 shows a schematic diagram of an exemplary design of an omni-band LNA 840 with a tunable matching circuit 830. Omni-band LNA 840 may be implemented based on any of the omni-band LNA designs described above. Omni-band LNA 840 includes an input that receives an input RF signal (RFin) and K outputs that provide output RF signals (RFout1 to RFoutK) for K band groups, where K may be any integer value greater than one. Tunable matching circuit 830 is coupled to the input of omni-band LNA 840 and performs input matching for LNA 840. Matching circuit 830 receives a received RF signal (RFrx) and provides the input RF signal to omni-band LNA 840. K load circuits 870a to 870k are coupled to the K outputs of omni-band LNA 840 and are designed for K band groups. Each load circuit 870 may comprise a transformer (e.g., as shown in FIG. 4A) and/or other circuit components.

Tunable matching circuit 830 may be implemented in various manners. Some exemplary designs of tunable matching circuit 830 are described below.

FIG. 9A shows an exemplary design of a tunable matching circuit 830a based on an L topology. The L topology includes a series circuit component coupled to a shunt circuit component. A series circuit component is a circuit component connected between two nodes. A shunt circuit component is a circuit component connected between a node and circuit ground. A circuit component may be an inductor, a capacitor, a resistor, etc. Matching circuit 830a includes (i) a series inductor 912 coupled between the input and output of matching circuit 830a and (ii) a tunable shunt capacitor 914 coupled between the output of matching circuit 830a and circuit ground.

FIG. 9B shows an exemplary design of a tunable matching circuit 830b based on the L topology. Matching circuit 830b includes (i) a tunable series capacitor 922 coupled between the input and output of matching circuit 830b and (ii) a shunt inductor 924 coupled between the output of matching circuit 830b and circuit ground.

FIG. 9C shows an exemplary design of a tunable matching circuit 830c based on an R topology. The R topology includes a shunt circuit component coupled to a series circuit component. Matching circuit 830c includes (i) a tunable shunt capacitor 932 coupled between the input of matching circuit 830c and circuit ground and (ii) a series inductor 934 coupled between the input and output of matching circuit 830c.

FIG. 9D shows an exemplary design of a tunable matching circuit 830d based on a Pi topology. The Pi topology includes a shunt circuit component coupled to a series circuit component, which is coupled to another shunt circuit component. Matching circuit 830d includes (i) a shunt capacitor 942 coupled between the input of matching circuit 830d and circuit ground, (ii) a series inductor 944 coupled between the input and output of matching circuit 830d, and (iii) a tunable shunt capacitor 946 coupled between the output of matching circuit 830d and circuit ground.

FIG. 9E shows an exemplary design of a tunable matching circuit 830e with two R sections. Matching circuit 830e includes (i) a shunt inductor 952 coupled between the input of matching circuit 830e and the VDD supply, (ii) a series capacitor 954 coupled between the input of matching circuit 830e and node E, (iii) a tunable shunt capacitor 956 coupled between node E and circuit ground, and (iv) a series inductor 958 coupled between node E and the output of matching circuit 830e.

FIG. 9F shows an exemplary design of a tunable matching circuit 830f based on the Pi topology. Matching circuit 830f includes (i) a shunt inductor 962 coupled between the input of matching circuit 830f and the VDD supply, (ii) a series capacitor 964 coupled between the input and output of matching circuit 830f, (iii) a tunable shunt capacitor 966 coupled between the output of matching circuit 830f and circuit ground, and (iv) a shunt inductor 968 coupled between the output of matching circuit 830f and circuit ground.

A fixed matching circuit may also be implemented based on any of the exemplary designs shown in FIGS. 9A to 9F. In this case, each adjustable circuit component (e.g., each adjustable capacitor) may be replaced with a fixed circuit component (e.g., a fixed capacitor).

Transformers for different band groups may be implemented in various manners. The primary and secondary coils of a transformer may be implemented with various patterns to obtain the desired inductance and coupling. The primary and secondary coils may also be fabricated on one or more conductive layers.

Figure 10:
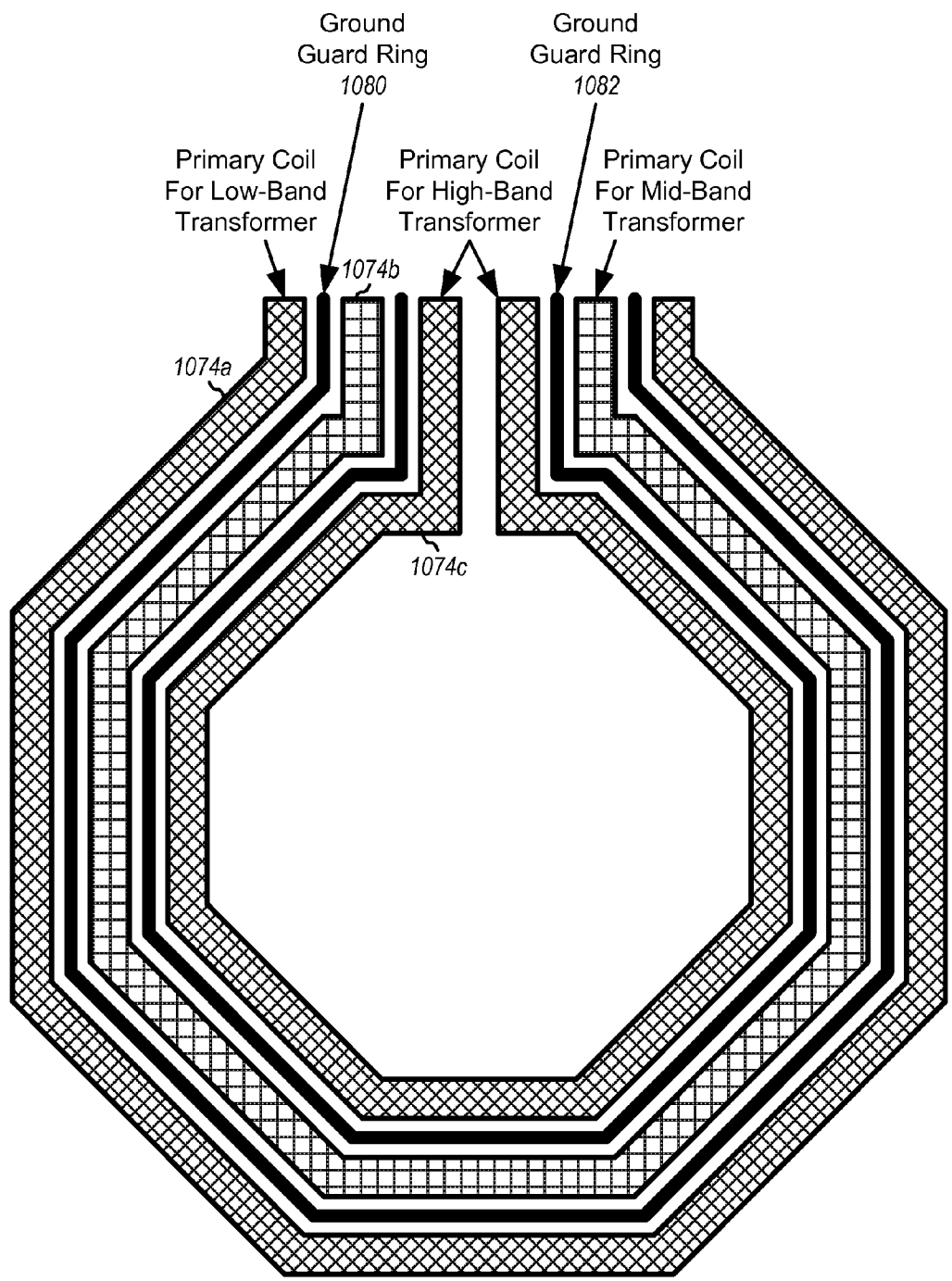
FIG. 10 shows a top view of three transformers for three band groups.

FIG. 10 shows a top view of an exemplary design of three transformers for three band groups. The three transformers may be used for transformers 472a to 472c in FIG. 4A, load circuits 570a to 570c in FIG. 5, load circuits 670a to 670c in FIG. 6, or load circuits 870a to 870c in FIG. 8.

In the exemplary design shown in FIG. 10, a transformer for low-band includes a primary coil 1074a formed in a spiral pattern on a first conductive layer. A transformer for mid-band includes a primary coil 1074b formed in a spiral pattern inside of primary coil 1074a on the first conductive layer. A transformer for high-band includes a primary coil 1074c formed in a spiral pattern inside of primary coil 1074b on the first conductive layer. A ground guard ring 1080 is located between primary coils 1074a and 1074b and provides isolation between these two primary coils. A ground guard ring 1082 is located between primary coils 1074b and 1074c and provides isolation between these primary coils.

In an exemplary design, secondary coils for the three transformers may be arranged in a spiral pattern on a second conductive layer. The secondary coil for each transformer 1072 may be formed directly underneath the primary coil for that transformer.

FIG. 10 shows an exemplary design in which three primary coils 1074a, 1074b and 1074c for three transformers for three band groups are formed inside of one another, which may save space. In general, the primary and secondary coils of the transformers for different band groups may be implemented with any layout, any pattern, and any number of turns. The number of turns, the diameter of the turns, the width and height of each coil, the spacing between the primary and secondary coils for each transformer, and/or other attributes of the two coils may be selected to obtain the desired inductance and quality factor (Q) for each coil and the desired coupling coefficient between the coils. The coupling coefficient may be varied by controlling the placement of the coils and/or the distance between the coils.

The stacked topology in FIG. 10 may allow the transformers to be fabricated in a smaller area and may also result in better matching between the two ends of the secondary coil for a differential design. Transformers may also be implemented with a side-by-side topology or other topologies. In general, different topologies, layout patterns, and fabrication techniques may provide different advantages for a transformer.

The omni-band amplifiers (e.g., LNAs) described herein may provide various advantages. First, an omni-band amplifier can support a wide frequency range covering multiple band groups, which may be highly desirable for new wireless devices that are required to support many bands in different band groups. Second, an omni-band amplifier may have good performance for all supported band groups, e.g., via use of a transformer and source degeneration for each band group. Third, an omni-band amplifier may reduce the number of input/output (I/O) pins on an IC chip since a single I/O pin can provide an input RF signal to support multiple band groups. Fourth, an omni-band amplifier may provide more flexibility since each I/O pin can be configured to support any band group. For example, an IC may include 20 omni-band LNAs and may be configured to support (i) 20 low-band receivers, or (ii) 10 low-band receivers, 5 mid-band receivers, and 5 high-band receivers, or (iii) 10 mid-band receivers and 10 high-band receivers, or (iv) some other combination of receivers. The omni-band amplifiers may have other advantages.

In an exemplary design, an apparatus (e.g., a wireless device, an IC, a circuit module, etc.) may include at least one gain transistor and a plurality of cascode transistors for a plurality of band groups. The at least one gain transistor (e.g., gain transistors 454 in FIG. 4A) may receive an input RF signal and may have the input(s) coupled together. The plurality of cascode transistors (e.g., cascode transistors 456) may be coupled to the at least one gain transistor and may provide an output RF signal for one of the plurality of band groups. The plurality of band groups may include low-band, mid-band, and/or high-band. Each band group may cover a plurality of bands.

In an exemplary design that is shown in FIG. 4A, the at least one gain transistor may comprise a plurality of gain transistors (e.g., gain transistors 454) for the plurality of band groups. One of the plurality of gain transistors and one of the plurality of cascode transistors may be enabled to amplify the input RF signal and provide the output RF signal for the selected band group. In an exemplary design, the plurality of gain transistors may have different transistor sizes and/or different bias currents. In an exemplary design, the apparatus may further comprise an inductor (e.g., inductor 452 in FIG. 4A) having a plurality of taps coupled to the plurality of gain transistors and circuit ground. In another exemplary design, the apparatus may further comprise a plurality of inductors (e.g., inductors 552 in FIG. 5) coupled between the plurality of gain transistors and circuit ground.

In another exemplary design that is shown in FIG. 6, the at least one gain transistor may comprise a single gain transistor (e.g., gain transistor 654) coupled to the plurality of cascode transistors. This gain transistor may have its source coupled directly to circuit ground (e.g., as shown in FIG. 6) or to a source degeneration inductor.

In an exemplary design, the apparatus may include a feedback circuit (e.g., feedback circuit 460 in FIG. 7) coupled between at least one of the plurality of cascode transistors and the at least one gain transistor. The feedback circuit may comprise a resistor, or a capacitor, or a transistor, or some other circuit component, or a combination thereof. The feedback circuit may be closed around a selected amplifier circuit, e.g., between a cascode transistor and a gain transistor for the selected amplifier circuit.

In an exemplary design, the apparatus may further comprise a tunable matching circuit (e.g., tunable matching circuit 830 in FIG. 8) coupled to the at least one gain transistor. The tunable matching circuit may receive a received RF signal and provide the input RF signal. The tunable matching circuit may comprise at least one adjustable circuit component (e.g., an adjustable capacitor).

In an exemplary design, the apparatus may further comprise a plurality of transformers (e.g., transformers 472 in FIG. 4A) coupled to the plurality of cascode transistors. Each of the plurality of transformers may be used for one of the plurality of band groups.

In an exemplary design, the at least one gain transistor may comprise a first gain transistor for a first band group and a second gain transistor for a second band group. The plurality of cascode transistors may comprise a first cascode transistor for the first band group and a second cascode transistor for the second band group. The first gain transistor may be coupled to the first cascode transistor. The second gain transistor may be coupled to the second cascode transistor. An inductor may be coupled between the first gain transistor and circuit ground and may comprise a tap coupled to the second gain transistor. A first transformer for the first band group may be coupled to the first cascode transistor. A second transformer for the second band group may be coupled to the second cascode transistor. The first transformer may comprise a first primary coil formed on a conductive layer. The second transformer may comprise a second primary coil formed within the first primary coil on the conductive layer (e.g., as shown in FIG. 10).

In an exemplary design, the at least one gain transistor may further comprise a third gain transistor for a third band group. The plurality of cascode transistors may further comprise a third cascode transistor for the third band group. The third gain transistor may be coupled to the third cascode transistor. A third transformer for the third band group may be coupled to the third cascode transistor.

Figure 11:
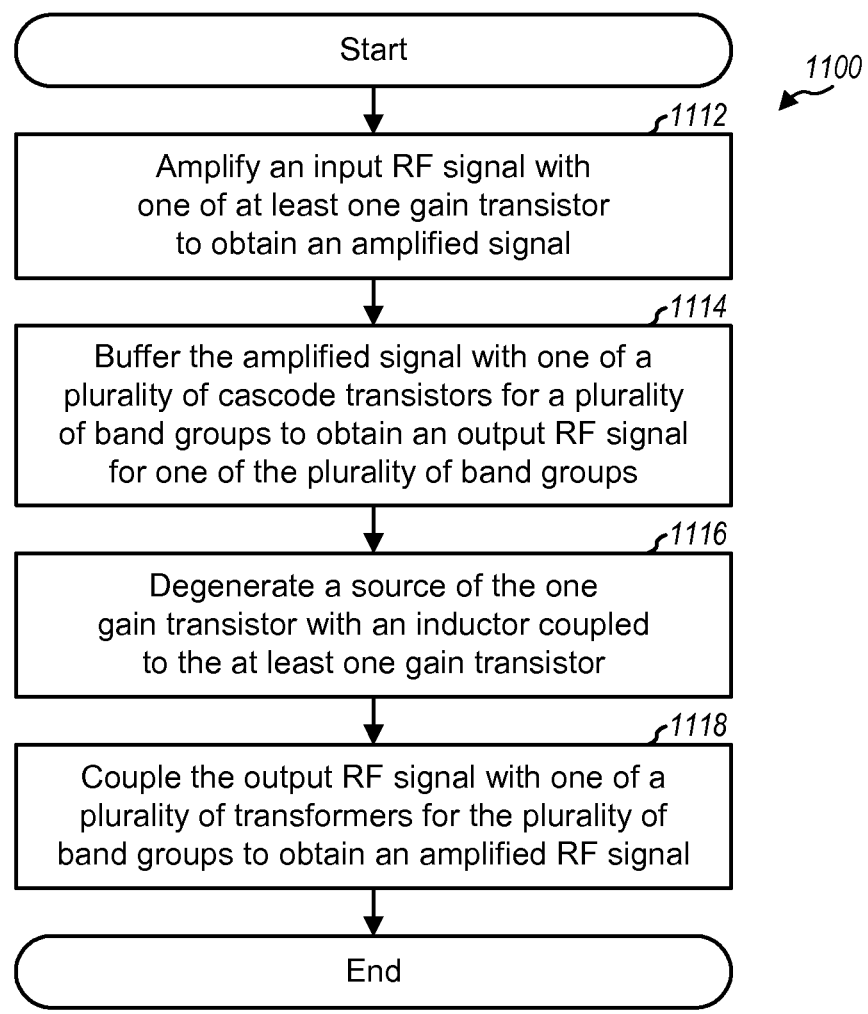
FIG. 11 shows a process for performing signal amplification.

FIG. 11 shows an exemplary design of a process 1100 for performing signal amplification. An input RF signal may be amplified with one of at least one gain transistor to obtain an amplified signal (block 1112). The amplified signal may be buffered with one of a plurality of cascode transistors for a plurality of band groups to obtain an output RF signal for one of the plurality of band groups (block 1114). The source of the one gain transistor may be degenerated with an inductor coupled to the at least one gain transistor (block 1116). The output RF signal may be coupled with one of a plurality of transformers for the plurality of band groups to obtain an amplified RF signal (block 1118).

The omni-band amplifiers described herein may be implemented on an IC, an analog IC, an RFIC, a mixed-signal IC, an ASIC, a printed circuit board (PCB), an electronic device, etc. The omni-band amplifiers may also be fabricated with various IC process technologies such as complementary metal oxide semiconductor (CMOS), N-channel MOS (NMOS), P-channel MOS (PMOS), bipolar junction transistor (BJT), bipolar-CMOS (BiCMOS), silicon germanium (SiGe), gallium arsenide (GaAs), heterojunction bipolar transistors (HBTs), high electron mobility transistors (HEMTs), silicon-on-insulator (SOI), etc.

An apparatus implementing an omni-band amplifier described herein may be a stand-alone device or may be part of a larger device. A device may be (i) a stand-alone IC, (ii) a set of one or more ICs that may include memory ICs for storing data and/or instructions, (iii) an RFIC such as an RF receiver (RFR) or an RF transmitter/receiver (RTR), (iv) an ASIC such as a mobile station modem (MSM), (v) a module that may be embedded within other devices, (vi) a receiver, cellular phone, wireless device, handset, or mobile unit, (vii) etc.

In one or more exemplary designs, the functions described may be implemented in hardware, software, firmware, or any combination thereof. If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and blu-ray disc where disks usually reproduce data magnetically, while discs reproduce data optically with lasers. Combinations of the above should also be included within the scope of computer-readable media.

The previous description of the disclosure is provided to enable any person skilled in the art to make or use the disclosure. Various modifications to the disclosure will be readily apparent to those skilled in the art, and the generic principles defined herein may be applied to other variations without departing from the scope of the disclosure. Thus, the disclosure is not intended to be limited to the examples and designs described herein but is to be accorded the widest scope consistent with the principles and novel features disclosed herein.

What is claimed is:

1. An apparatus comprising:
   at least one gain transistor configured to receive an input radio frequency (RF) signal and formed on an integrated circuit; and
   a plurality of cascode transistors each corresponding to a respective band group of a plurality of band groups coupled to the at least one gain transistor and each of the plurality of cascode transistors configured to provide an output RF signal for the respective band group of the plurality of band groups and formed on the integrated circuit, wherein each cascode transistor is coupled to a respective load circuit for the respective band group, wherein each of the load circuits are formed on the integrated circuit and comprise a transformer coupled to the respective cascode transistor, and wherein a secondary side of the transformer provides a separate output for the respective band group of the plurality of band groups.

2. The apparatus of claim 1, wherein the at least one gain transistor comprising a plurality of gain transistors for the plurality of band groups.

3. The apparatus of claim 2, further comprising:
   an inductor comprising a plurality of taps coupled to the plurality of gain transistors and circuit ground.

4. The apparatus of claim 2, further comprising:
   a plurality of inductors coupled between the plurality of gain transistors and circuit ground.

5. The apparatus of claim 2, wherein the plurality of gain transistors having different transistor sizes, or different bias currents, or both.

6. The apparatus of claim 1, wherein the at least one gain transistor comprising a single gain transistor coupled to the plurality of cascode transistors.

7. The apparatus of claim 1, further comprising:
   a feedback circuit coupled between at least one of the plurality of cascode transistors and the at least one gain transistor.

8. The apparatus of claim 1, further comprising:
   a tunable matching circuit coupled to the at least one gain transistor and configured to receive a received RF signal and provide the input RF signal.

9. The apparatus of claim 1, wherein the at least one gain transistor comprising a first gain transistor for a first band group and a second gain transistor for a second band group, and the plurality of cascode transistors comprising a first cascode transistor for the first band group and a second cascode transistor for the second band group.

10. The apparatus of claim 9, further comprising:
    an inductor coupled between the first gain transistor and circuit ground and comprising a tap coupled to the second gain transistor.

11. The apparatus of claim 9, comprising:
    a first transformer for the first band group coupled to the first cascode transistor, and
    a second transformer for the second band group coupled to the second cascode transistor.

12. The apparatus of claim 11, wherein the first transformer comprising a first primary coil formed on a conductive layer, and the second transformer comprising a second primary coil formed within the first primary coil on the conductive layer.

13. The apparatus of claim 9, wherein the at least one gain transistor further comprising a third gain transistor for a third band group, and the plurality of cascode transistors further comprising a third cascode transistor for the third band group.

14. The apparatus of claim 1, wherein the plurality of band groups including at least one of low-band, mid-band, and high-band.

15. The apparatus of claim 1, wherein for each selected one of the plurality of band groups a corresponding one of the plurality of cascode transistors is selected and the other cascode transistors of the plurality remain unselected.

16. A method comprising:
    amplifying an input radio frequency (RF) signal with one of at least one gain transistor formed on an integrated circuit to obtain an amplified signal;
    buffering the amplified signal with one of a plurality of cascode transistors each corresponding to a respective band group of a plurality of band groups and each of the plurality of cascode transistors configured to provide an output RF signal for the respective band group of the plurality of band groups; and
    passing the output RF signal through one of a plurality of load circuits, each load circuit comprising a transformer which is coupled to a respective cascode transistor and formed on the integrated circuit; and
    separately outputting from the transformer a signal for the respective band group of the plurality of band groups.

17. The method of claim 16, further comprising:
    degenerating a source of the one gain transistor with an inductor coupled to the at least one gain transistor.

18. The method of claim 16, wherein the passing comprises:
    coupling the output RF signal with one of the transformers, the one of the transformers being for one of the plurality of band groups to obtain an amplified RF signal.

19. An apparatus comprising:
    at least one amplifying means configured to receive an input radio frequency (RF) signal;
    a plurality of buffering means each corresponding to a respective band group of a plurality of band groups coupled to the at least one amplifying means and each of the plurality of buffering means configured to provide an output RF signal for the respective band group of the plurality of band groups; and a plurality of load means each for a respective band group of the plurality of band groups and coupled to a respective one of the plurality of buffering means, the plurality of load means comprising a plurality of transforming means coupled to the plurality of buffering means, the plurality of load means being formed on a common integrated circuit with the plurality of buffering means, each of the transforming means comprising secondary means for providing a separate output for the respective band group of the plurality of band groups.

20. The apparatus of claim 19, wherein the at least one amplifying means comprising a plurality of amplifying means for the plurality of band groups, the apparatus further comprising:

source degeneration means comprising a plurality of taps coupled to the plurality of amplifying means and circuit ground.

* * * * *